United States Patent
Ghoshal (12)

(10) Patent No.: US 6,474,074 B2
(45) Date of Patent: Nov. 5, 2002

(54) APPARATUS FOR DENSE CHIP PACKAGING USING HEAT PIPES AND THERMOELECTRIC COOLERS

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/726,291

(22) Filed: Nov. 30, 2000

(65) Prior Publication Data
US 2002/0062648 A1 May 30, 2002

(51) Int. Cl.⁷ .......................... F25B 21/02; F25D 23/12
(52) U.S. Cl. ................ 62/3.7; 62/259.2; 165/104.33; 165/104.21; 361/688
(58) Field of Search .................. 62/259.2, 3.7; 165/104.21, 104.33, 104.14, 104.26, 46; 361/688, 697, 702

(56) References Cited

U.S. PATENT DOCUMENTS

| | | | | |
|---|---|---|---|---|
| 4,962,416 A | * | 10/1990 | Jones et al. | |
| 5,069,274 A | * | 12/1991 | Haslett et al. | 165/104.26 X |
| 5,111,874 A | * | 5/1992 | Kosson | 165/104.26 X |
| 5,168,919 A | * | 12/1992 | Berenholz et al. | 165/104.33 X |
| 5,179,043 A | * | 1/1993 | Weichold et al. | 165/104.33 X |
| 5,205,348 A | * | 4/1993 | Tousignant et al. | 165/46 |
| 5,383,340 A | * | 1/1995 | Larson et al. | 62/259.2 |
| 5,646,822 A | * | 7/1997 | Bhatia et al. | 165/104.33 X |
| 5,646,824 A | * | 7/1997 | Ohashi et al. | 361/699 |
| 5,704,416 A | * | 1/1998 | Larson et al. | 165/104.33 |
| 5,769,154 A | | 6/1998 | Adkins et al. | 165/104.26 |
| 5,899,265 A | * | 5/1999 | Schneider et al. | 165/104.33 |
| 5,947,183 A | | 9/1999 | Schneider et al. | 164/425 |
| 6,097,597 A | * | 8/2000 | Kobayashi | 361/687 |
| 6,164,368 A | * | 12/2000 | Furukawa et al. | 165/104.33 |
| 6,167,948 B1 | * | 1/2001 | Thomas | 165/104.26 |
| 6,269,865 B1 | * | 8/2001 | Huang | 165/104.26 |

FOREIGN PATENT DOCUMENTS

JP    61153384 A  *  7/1986

OTHER PUBLICATIONS

Bejan, "Advanced Engineering Thermodynamics", Second Edition, 1997, pp. 704–814.

* cited by examiner

Primary Examiner—Chen-Wen Jiang
(74) Attorney, Agent, or Firm—Duke W. Yee; Casimer K. Salys; Stephen J. Walder, Jr.

(57) ABSTRACT

An apparatus for dense chip packaging using heat pipes and thermoelectric coolers is provided. The apparatus includes an evaporator region, a condenser region, and a capillary region. The evaporator region includes one or more hot point elements used to transfer heat from a heat source to a transport fluid. The transport fluid changes state to a vapor when heat is applied to the transport fluid. The vapor travels to the condenser region via vapor channels and is condensed to a fluid once again by transferring heat from the vapor to a heat sink. The condensed fluid is then returned to the evaporator region by way of capillary forces and capillaries formed in a capillary structure. The capillaries formed in the capillary structure have a tree-like or fractal geometry. The apparatus may further include a flexible region that allows the apparatus to be bent around corners and edges.

41 Claims, 4 Drawing Sheets

APPARATUS FOR DENSE CHIP PACKAGING USING HEAT PIPES AND THERMOELECTRIC COOLERS

BACKGROUND OF THE INVENTION

1. Technical Field

The present invention is directed to an apparatus for dense chip packaging using heat pipes and thermoelectric coolers.

2. Description of Related Art

Increasing power density in electronic circuits creates a need for improvements to systems for transferring heat away from the circuit. The power density increases as the level of integration and speed of operation increase. Therefore, as electronic circuits become more integrated and operational speeds increase, the need to transfer heat away from the circuits becomes of great importance.

Heat pipes can help improve heat rejection from integrated circuits. Micro-heat pipes use small ducts filled with a working fluid to transfer heat from high temperature devices. The ducts are typically straight channels, cut or milled into a surface. Evaporation and condensation of the fluid transfers heat through the duct. The fluid vaporizes in the heated region of the duct. The vapor travels to the cooled section of the duct, where it condenses. The condensed liquid collects in the corners of the duct, and capillary forces pull the fluid back to the evaporator region. The fluid is in a saturated state so the inside of the duct is nearly isothermal.

U.S. Pat. Nos. 5,769,154 and 5,947,183, which are hereby incorporated by reference, disclose a wick structure for distributing fluid within a heat pipe system. The wick structure allows fluid flow in multiple directions to thereby return fluid to heated regions. These wick structures, however, have high fluid resistance due to the wick structures having an arbitrary configuration, are not efficient in terms of transferring heat to the fluid, and are not flexible thus limiting the use of such wick structures to rigid applications. Therefore, it would be beneficial to have a heat pipe apparatus with improved capillary structures and vapor chambers to thereby improve the operational of the heat pipes. In addition, it would be beneficial to have a heat pipe apparatus that is flexible so that it can be used in a plurality of different implementations.

SUMMARY OF THE INVENTION

An apparatus for dense chip packaging using heat pipes and thermoelectric coolers is provided. The apparatus includes an evaporator region, a condenser region, and a capillary region. The evaporator region includes one or more hot point elements used to transfer heat from a heat source to a transport fluid. The transport fluid changes state to a vapor when heat is applied to the transport fluid. The vapor travels to the condenser region via vapor channels and is condensed to a fluid once again by transferring heat from the vapor to a heat sink. The condensed fluid is then returned to the evaporator region by way of capillary forces and capillaries formed in a capillary structure. The capillaries formed in the capillary structure have a tree-like or fractal geometry. The apparatus may further include a flexible region that allows the apparatus to be bent around corners and edges.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
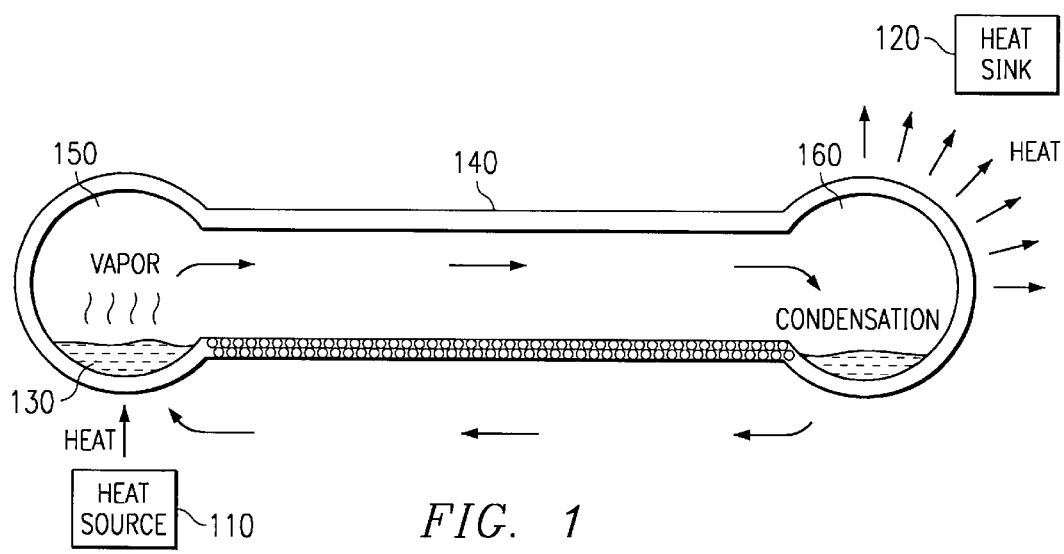
FIG. 1 is an exemplary block diagram illustrating the basic operation of a heat pipe.

FIG. 1 is an exemplary block diagram illustrating the basic operation of a heat pipe. As shown in FIG. 1, a heat pipe serves to transfer heat from a heat source 110 to a heat sink 120. Heat from the heat source 110 is transferred to a cooling liquid 130 which is transformed into a vapor by the heat. The vapor travels down the heat pipe 140 from a vapor chamber 150 to a condenser chamber 160. In the condenser chamber 160, heat is conducted to the heat sink 120 and, as a result, the vapor is transformed back-into a liquid.

The condensed liquid in condenser chamber 160 is returned to the vapor chamber 150 by virtue of, capillary forces in the material that makes up the heat pipe structure. For example, the heat pipe may be comprised of a porous glass material (depicted as a section of wall having circular pores). The pores in the glass material provide channels by which the cooling liquid may return to the vapor chamber 150. Since there is a pressure differential and the cooling liquid is attracted to other portions of cooling liquid by surface tension, capillary forces cause the cooling liquid to return to the vapor chamber 150 through the pores in the glass material.

The present invention provides an improved heat pipe structure for use with integrated circuit chips. The present invention makes use of elements in an evaporator to provide efficient phase changes and effective heat removal by vapors. In addition, the present invention makes use of capillary structures based on fractal and constructural geometries that provide maximum capillary forces with minimum flow resistance. Moreover, the present invention includes a flexible structure that is easily bent around corners and edges.

Figure 2:
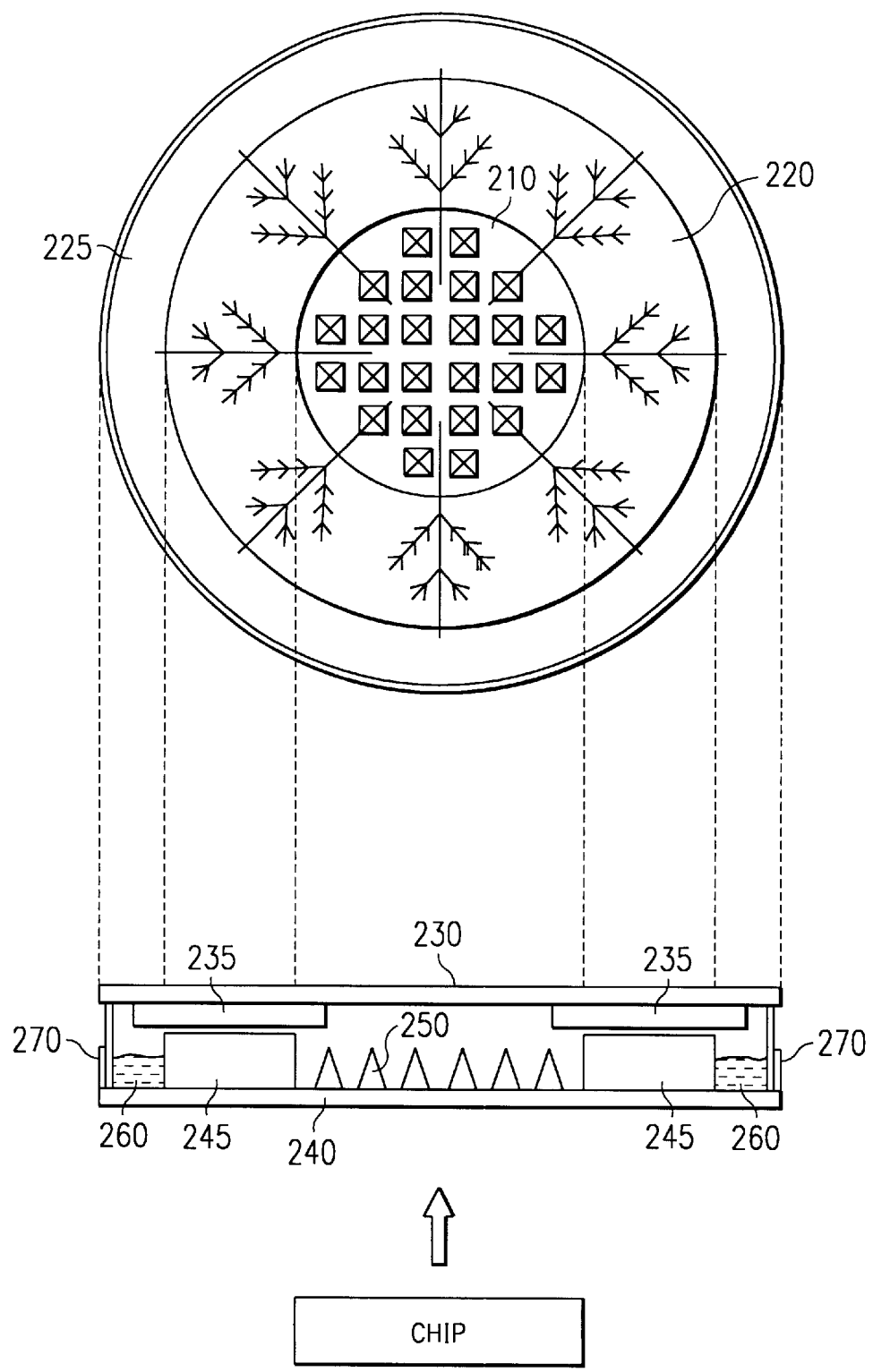
FIG. 2 is an exemplary block diagram illustrating a top view and a cross sectional view of a heat pipe structure in accordance with the present invention.

FIG. 2 is an exemplary block diagram illustrating a top view and cross sectional view of a heat pipe structure in accordance with the present invention. As shown in FIG. 2, the heat pipe structure of the present invention includes three primary regions, an evaporator region 210, a capillary region 220, and a condenser region 225. The various regions, in the depicted example, are formed by concentric circles with the evaporator region 210 being placed in a center, the capillary region 220 being formed around the evaporator region 210, and the condenser region 225 being formed around the capillary region 220.

The evaporator region 210 serves to transfer heat from a heat source to a transport fluid which is used to transport the heat to a heat sink. The heat source may be any type of device that is capable of generating heat. In the preferred embodiment of the present invention, the heat source is a hot integrated circuit chip. The heat source is placed on the back side of the evaporator region 210 such that heat from the heat source is transferred from the heat source to elements in the evaporator region 210, which in turn transfer the heat to the transport fluid.

The transport fluid may be any type of liquid that is capable of changing states from a liquid state to a vapor state when heat is applied. The particular transport fluid used may depend on operating temperatures of the heat source and the vapor point of the transport fluid. For example, if the heat source operates in a temperature range of 25° C. to 50° C., the transport fluid may be an alcohol, such as methanol which has a vapor point of about 50° C. For temperature ranges higher than 50° C., water may be used, for example. For temperature ranges less than 25° C., freon may be used, for example. Other transport fluids may be used without departing from the spirit and scope of the present invention.

When heat is transferred to the transport fluid in the evaporator region 210, the transport fluid changes states to a vapor state. The vapor travels through vapor channels in the capillary region 220 to the condenser region 225. A heat sink associated with the condenser region 225 absorbs the heat from the vapor causing the vapor to change states back into a liquid state. The condensation of the transport fluid is then returned to the evaporator region 210 via capillaries in the capillary region 220.

Capillary forces of the liquid cause the transport fluid to move toward the center of the heat pipe structure, i.e. to the evaporator region 210. The capillaries in the capillary region 220 are formed as tree-like structures. The tree-like structure provides larger capillary forces with a minimum of surface resistance. Such tree-like structures are generally described in Adrian Bejan's *Advanced Engineering Thermodynamics*, chapter 13, John Wiley and Sons, copyright 1997, which is hereby incorporated by reference.

While the tree-like structure is easiest to form in the capillary region 220, other structures may be used without departing from the spirit and scope of the present invention. In a preferred embodiment, for example, the capillary structure is defined using fractal geometries. The use of fractal geometries allows the perimeter of the fractal geometry to theoretically increase to infinity while the area of the geometry remains the same. The fractal geometry may be determined by defining the capillary region area and then using a fractal- algorithm, such as Kohn's algorithm, to fill the defined area. The resulting geometry may then be etched into the capillary region substrate.

A cross sectional view of the regions 210–230 is also provided in FIG. 2. The elements shown in FIG. 2 are not to scale and relative dimensions are exaggerated for ease of illustration. Thus, FIG. 2 is only provided for explanation purposes and is not intended to provide a "blueprint" for constructing the heat pipe structure of the present invention.

As shown in FIG. 2, the top and bottom of the heat pipe structure are comprised of substrates 230 and 240. These substrates 230 and 240 may be comprised of any material capable of housing the elements discussed hereafter. For example, the substrates 230 and 240 may be comprised of high thermal conductivity materials, such as copper, silicon, isotopic silicon Si-28, copper plated silicon and the like. For example, the substrates 230 and 240 in a preferred embodiment, are comprised of copper due to its high thermal conductivity and relative lower cost than other materials.

The evaporator region 210 includes a plurality of elements 250 for transferring the heat from the heat source, e.g. an integrated circuit chip, to a transport fluid. The elements 250 may be any type of element capable of transferring heat from a heat source to a transport fluid. In a preferred embodiment of the present invention, the elements 250 are conically shaped hot points. Conically shaped hot points are used in the preferred embodiment because sharp points increase the heat flux density with more nucleation sites for forming vapor. The heat is transferred from the hot points to the transport fluid which vaporizes. The manufacture and use of conically shaped hot point arrays are described in, for example, commonly assigned and copending U.S. patent application Ser. Nos. 09/731,616 (attorney docket No. AUS9-2000-0414-US1) entitled "ENHANCED INTERFACE THERMOELECTRIC COOLERS WITH ALL-METAL TIPS", 09/731,997 (attorney docket No. AUS9-2000-0415-US 1) entitled "THERMOELECTRIC COOLERS WITH ENHANCED STRUCTURED INTERFACES", 09/731,614 (attorney docket No. AUS9-2000-0556-US1) entitled "ENHANCED INTERFACE THERMOELECTRIC COOLERS WITH ALL-METAL TIPS", and 09/731,999 (attorney docket No. AUS9-2000-0564-US 1) entitled "COLD POINT DESIGN FOR EFFICIENT THERMOELECTRIC COOLERS", which are each hereby incorporated by reference.

While "conically shaped" hot points are disclosed as being used in the preferred embodiment, the shape of the body of the hot points does not need to be conical. Rather, any configuration may be used as long as the hot points terminate at a tapered point. Thus, pyramidal hot points, for example, may be used rather than conical shaped hot points.

Capillary region 220 includes vapor channels 235 and capillary structures 245. The vapor channels 235 are used to transport vapor from the evaporator region 210 to the condenser region 225. The capillary structures 245 include capillaries formed in the capillary structures 245. The capillaries in the capillary structure 245 provide channels through which condensed transport fluid may be returned to the evaporator region 210.

The capillaries in the capillary structure 245 may be formed by, for example, photolithographic masking and reactive ion etching techniques. Electroplating processing may also be used to form the capillary structure 245. Laser cutting of the substrate can also form suitable capillary structures. Generally, processes adapted to micromachining can be used to form the capillary structure 245 of the present invention without departing from the spirit and scope of the present invention.

The condenser region 225 includes condensed transport fluid 260 and seals 270. A heat sink such as a cold plate (not shown), thermoelectric cooler, heat dissipating fins, or the like, can be mounted on the opposing surface of substrate 230. The seals 270 serve to seal the heat pipe structure in order to allow proper cyclical operation of the heat pipe structure and to prevent contaminants from entering the heat pipe structure. Alternatively, the substrates 230 and 240 can be hermetically sealed by boron-phosphorous-silicate-glass bonding, for example.

The transport fluid can be introduced to the heat pipe structure through a port (not shown) into the volume defined by the substrates 230, 240 and the seals 270. If necessary, the transport fluid can be introduced through the port into the heat pipe structure while under a vacuum. The port may then be sealed by, for example, epoxy filling or a laser fusion weld. The heat pipe structure may also be filled via an injection fill, boil off and crimp seal process known to those skilled in the art. The amount of transport fluid introduced to the heat pipe structure is enough so that condensation droplets in the condenser region 225 can bridge between the condenser region surface of the substrate 240 and the capillary structure 245.

The condensed transport fluid 260 is obtained from vapor condensing in the condenser region 225 due to heat being absorbed by a heat sink (not shown). The loss in heat in the vapor causes the vapor to change state back into a liquid state. The liquid then collects at the bottom of the condenser region by gravity or a local wick structure and is transported back to the evaporator region 210 via the capillaries in the capillary structure 245.

Figure 3:
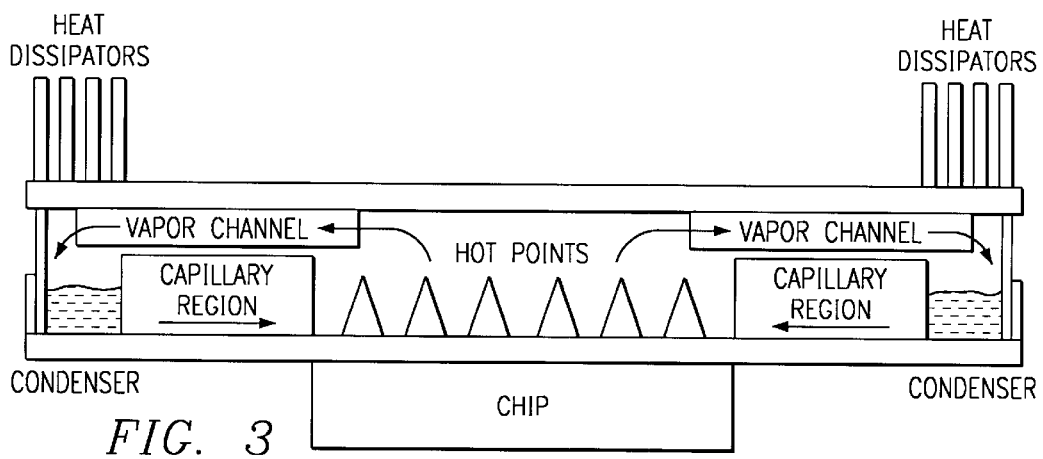
FIG. 3 is an exemplary block diagram illustrating an operation of the heat pipe structure of FIG. 2.

FIG. 3 is an exemplary block diagram illustrating the operation of an exemplary embodiment of the heat pipe structure of the present invention. As shown in FIG. 3, heat from the heat source is transferred from the chip to the transport fluid through the hot points. The transport fluid changes from a liquid state to a vapor state when the heat is applied. The vapor then travels through vapor channels in the capillary region to a condenser region.

In the condenser region, the heat in the vapor is transferred to the heat dissipators. The loss of heat causes the vapor to transform back into a liquid. The condensation of the transport fluid is contained in the bottom of the condenser region. Capillary forces of the liquid cause the transport fluid to travel through the capillaries, formed in the capillary region, back to the evaporator region and to the hot points. This process is cyclically repeated as long as the heat pipe structure is operational and there is a heat source.

As shown in FIGS. 2 and 3, the heat pipe structure of one preferred embodiment has a circular geometry. The circular geometry allows the heat pipe structure to be formed on most semiconductor silicon wafers as well as allows for positioning of integrated circuits in the evaporator region, which themselves are formed on circular silicon wafers. Furthermore, the circular geometry allows for ease of sealing the structure by sealing the outer edge or perimeter of the circular heat pipe structure.

Figure 4:
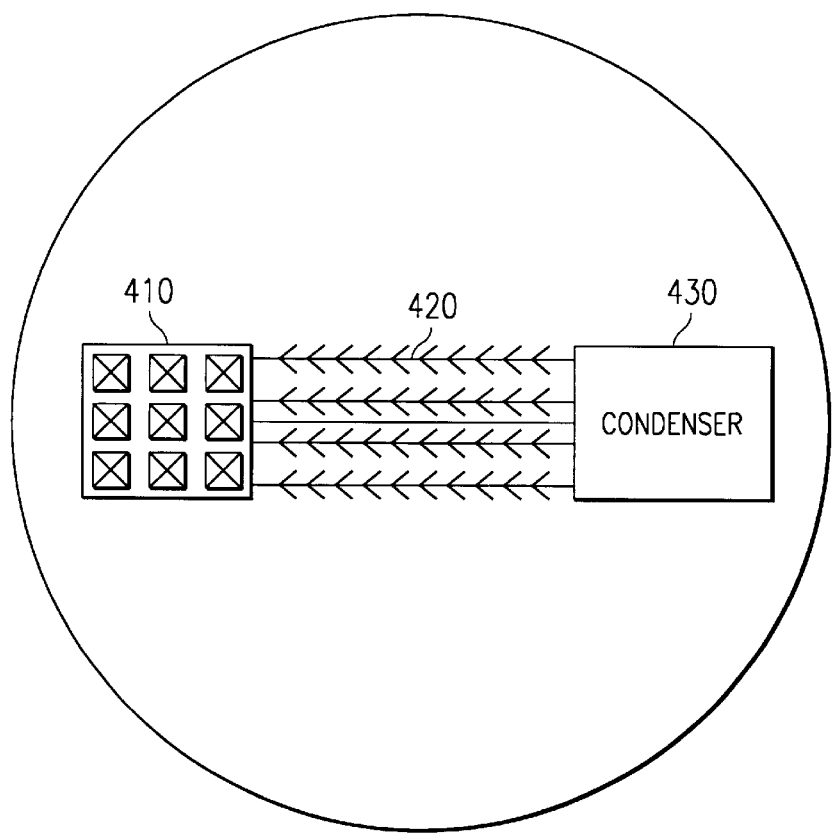
FIG. 4 is an exemplary diagram illustrating a linear heat pipe structure embodiment of the present invention.

Some applications of the present invention will lend themselves to a linear configuration of the heat pipe structure of the present invention. FIG. 4 shows an exemplary block diagram of a linear heat pipe structure in accordance with the present invention. As shown in FIG. 4, the heat pipe structure includes an evaporator region 410, a capillary region 420 and a condenser region 430 formed in a substrate 440 in a linear fashion. Once these regions are formed, the substrate may be etched to eliminate excess substrate.

Figure 5:
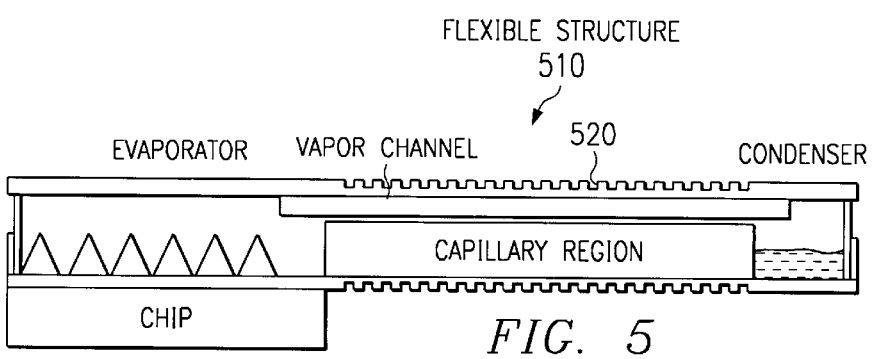
FIG. 5 is an exemplary block diagram illustrating a cross section of the linear heat pipe structure embodiment of the present invention.

FIG. 5 provides a cross sectional view of the linear heat pipe structure embodiment of the present invention. As shown in FIG. 5, the structure is essentially similar to that of the circular geometry embodiment with the exception that only one capillary region and one condenser region are provided in the cross section.

Moreover, the linear structure may contain a flexible structure region 510. The flexible region may span one or more of the evaporator region, capillary region and condenser region. In the depicted example, the flexible structure region 510 spans only the capillary region.

The flexible structure region 510 includes substrates 520 that are notched by etching. In addition, the vapor channels and capillary structure are formed from material that is capable of being flexed. For example, the vapor channels and capillary structures may be formed from electroplated copper, Si-28, or the like. Electroplated copper is used in a preferred embodiment due to its high thermal conductivity, ability to be easily formed, and relative cost.

The notches in the substrates 520, and flexible material of the heat pipe and capillary structure, allow the flexible structure region 510 to be flexed so that the overall heat pipe structure may be bent across edges, hinges and the like. The flexibility of the overall structure allows for various applications of the heat pipe structure of the present invention.

Figure 6:
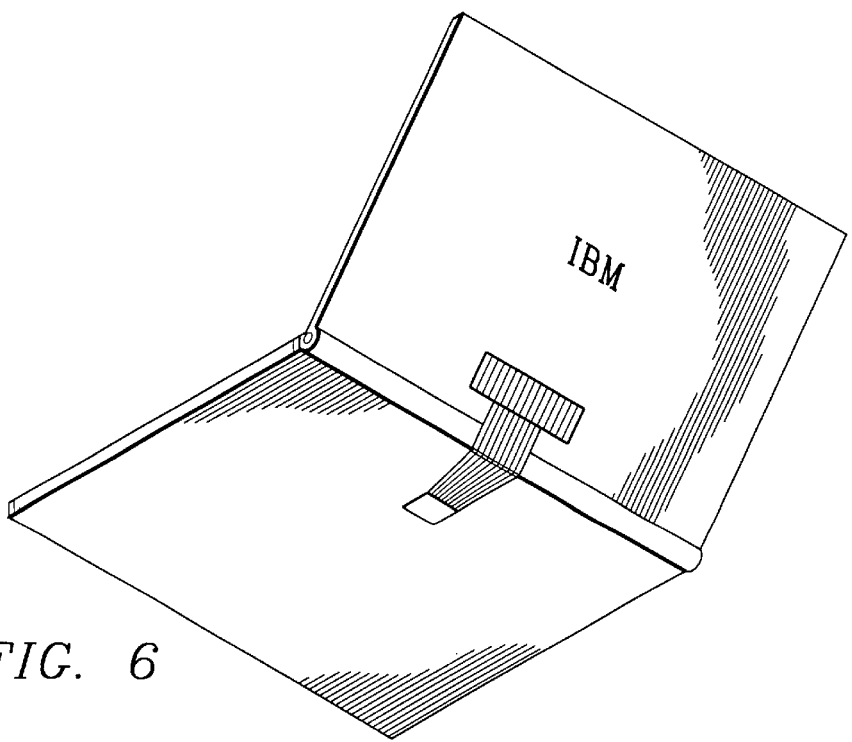
FIG. 6 is an exemplary block diagram illustrating an example implementation of the linear heat pipe structure embodiment of the present invention.

For example, as shown in FIG. 6, the heat pipe structure of the present invention may be used in laptop computers so that the heat dissipators are positioned on a surface of the laptop that is not typically used for heat dissipation. In conventional laptop computers, heat dissipation is performed using conventional heat dissipating mechanisms that require that the heat be dissipated through the bottom or a side surface of the laptop computer. This causes problems in that the amount of heat that can be dissipated from these locations is limited so as not to harm users that may touch these locations. As a result, operational temperatures of the processors in the laptop are limited since the amount of heat transferred out of the laptop must be limited.

Because the present invention provides a mechanism that is flexible, the heat from the processor of a laptop may be expelled through the top surface of a laptop computer. The flexibility of the present invention allows the heat pipe structure to be bent across the hinged area of the laptop such that the evaporator region is positioned adjacent the processor. The capillary region traverses a portion of the bottom of the laptop, crosses the hinged portion of the laptop, and traverses a portion of the top of the laptop. The condenser portion is positioned on the top of the laptop such that the heat transferred from the processor to the heat dissipators is expelled through the top surface of the laptop. Because the heat is expelled through a surface that does not typically sit on or near the user, the operating temperature of the processor may be increased with the amount of expelled heat being increased.

In addition to applications such as that shown in FIG. 6, many other applications of the heat pipe structure of the present invention may be made without departing from the spirit and scope of the present invention. For example, the heat pipe structure of the present invention may be used in hot integrated circuit chip stacks such as that shown in FIGS. 7A and 7B.

Figure 7A:
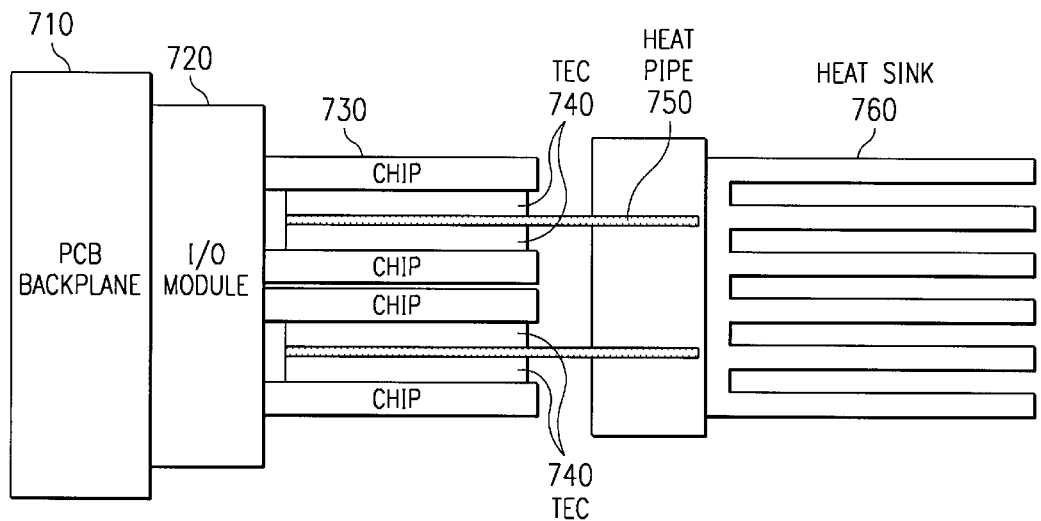
FIGS. 7A and 7B are exemplary block diagrams illustrating two possible configurations of chip packages using heat pipes of the present invention.
Figure 7B:
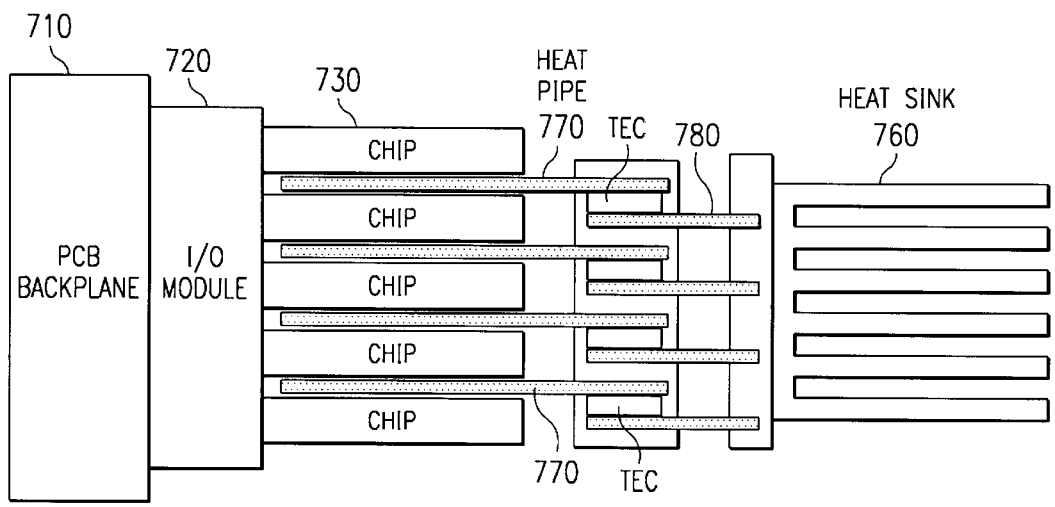

FIGS. 7A and 7B depict two possible implementations of the present invention. As shown in FIG. 7A, a first chip stack includes a printed circuit board (PCB) backplane 710, an input/output (I/O) module 720 coupled to the PCB backplane 710, and a plurality of chips 730 stacked on top of one another and coupled to the input/output module 720. The chip stack further includes thermoelectric coolers 740 and heat pipe structures 750 positioned between thermoelectric coolers 740.

The portion of the heat pipe structures 750 that is adjacent to the thermoelectric coolers is the evaporator region. Heat expelled from the thermoelectric coolers is absorbed by the elements in the evaporator region of the heat pipe structure, thereby causing transport fluid in the evaporator region to change to a vapor. The vapor travels through vapor channels down the heat pipe structure 750 to a condenser region associated with heat sink 760. There, the heat is transferred to the heat sink 760 which dissipates the heat to the ambient air. The vapor changes back to a liquid and is returned to the evaporator region by way of capillary forces and a capillary structure in the heat pipe structure 750.

FIG. 7B shows an alternative hot integrated circuit chip stack configuration in which chips are directly cooled by a first heat pipe structure 770. The heat is transferred to a thermoelectric cooler which in turn expels the heat to a second heat pipe structure 780. The second heat pipe structure then expels the heat to a heat sink. Heat pipes 770 and 780 operate at different temperatures as defined by the operating range of the thermoelectric cooler (TECH). Other arrangements of hot integrated circuit chips may be used without departing from the spirit and scope of the present invention.

Thus the present invention provides an improved heat pipe structure that uses elements in an evaporator region to efficiently transfer heat from a heat source to a transport fluid. The present invention makes use of capillary structures based on fractal and constructural geometries that provide maximum capillary forces with minimum flow resistance. Moreover, the present invention includes a flexible structure that is easily bent around corners and edges.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus for cooling a heat source, comprising:
   an evaporator region, having one or more hot point elements, each hot point element having a tapered end, for transferring heat from the heat source to a transport fluid;
   a condenser region associated with a heat sink; and
   a fractal-like coupling of the condenser region to the evaporator region.

2. The apparatus of claim 1, wherein the transport fluid changes to a vapor when heat from the heat source is applied to the transport fluid.

3. The apparatus of claim 2, wherein the vapor is condensed to a condensed transport fluid by transferring heat from the vapor to the heat sink.

4. The apparatus of claim 3, wherein the fractal-like coupling includes a capillary region having capillaries for returning the condensed transport fluid to the evaporator region.

5. The apparatus of claim 4, wherein the capillaries in the capillary region are formed using at least one fractal geometry.

6. The apparatus of claim 4, wherein the capillaries in the capillary region are formed by defining an area of the capillary region and using a fractal algorithm to fill the area of the capillary region.

7. The apparatus of claim 4, wherein the capillary region further includes vapor channels for transporting vapor from the evaporator region to the condenser region.

8. The apparatus of claim 4, wherein the capillaries are formed in the capillary region by one of photolithographic masking and etching.

9. The apparatus of claim 4, wherein at least one of the evaporator region, capillary region and condenser region are flexible structures.

10. The apparatus of claim 9, wherein the flexible structures have notches etched out of substrates of the flexible structures to thereby make the substrates flexible.

11. The apparatus of claim 1, wherein the apparatus is flexible.

12. The apparatus of claim 1, wherein the heat source is a hot integrated circuit chip.

13. The apparatus of claim 1, wherein the transport fluid is one of an alcohol, water or freon.

14. The apparatus of claim 1, wherein the apparatus is formed using high thermal conductivity materials.

15. The apparatus of claim 1, wherein the one or more hot point elements are conically shaped hot point elements.

16. The apparatus of claim 1, wherein the heat sink is one of a cold plate, a thermoelectric cooler, and heat dissipating fins.

17. The apparatus of claim 1, wherein the evaporator region and condenser region are concentrically disposed.

18. The apparatus of claim 1, wherein the apparatus has a linear geometry.

19. The apparatus of claim 1, wherein the heat source is a processor in a laptop computer and the heat sink is a heat dissipater in a top of the laptop computer.

20. The apparatus of claim 1, wherein the heat source is a integrated circuit chip in a chip stack.

21. A method of cooling a heat source, comprising:
    using an evaporator region, having one or more hot point elements, each hot point element having a tapered end, to transfer heat from the heat source to a transport fluid to thereby convert the transport fluid to a vapor;
    using a condenser region associated with a heat sink to transfer the heat from the vapor to the heat sink, wherein the vapor is converted to condensed transport fluid; and
    using a fractal-like coupling of the condenser region to the evaporator region.

22. The method of claim 21, further comprising returning the condensed transport fluid to the evaporator region via capillaries in a capillary region of the fractal-like coupling.

23. The method of claim 22, wherein the capillaries in the capillary region are formed using at least one fractal geometry.

24. The method of claim 21, wherein the heat source is a hot integrated circuit chip.

25. The method of claim 21, wherein the transport fluid is one of an alcohol, water or freon.

26. The method of claim 21, wherein the one or more hot point elements are conically shaped hot point elements.

27. The method of claim 21, wherein the heat source is a processor in a laptop computer and the heat sink is a heat dissipater in a top of the laptop computer.

28. The method of claim 21, wherein the heat source is a integrated circuit chip in a chip stack.

29. A method of making an apparatus for cooling a heat source, comprising:
    providing an evaporator region, having one or more hot point elements, each hot point element having a tapered end, for transferring heat from the heat source to a transport fluid, wherein the transport fluid is converted to a vapor when the heat is transferred from the hot point elements to the transport fluid;

providing a condenser region associated with a heat sink for condensing the vapor to a condensed transport fluid when heat is transferred from the vapor to the heat sink; and providing a fractal-like coupling of the condenser region to the evaporator region.

30. The method of claim 29, wherein the fractal-like coupling includes a capillary region having capillaries for returning the condensed transport fluid to the evaporator region.

31. The method of claim 30, wherein the capillaries in the capillary region are formed using at least one fractal geometry.

32. The method of claim 30, wherein the capillaries in the capillary region are formed by defining an area of the capillary region and using a fractal algorithm to fill the area of the capillary region.

33. The method of claim 30, further comprising providing vapor channels in the capillary region for transporting vapor from the evaporator region to the condenser region.

34. The method of claim 30, wherein the capillaries are formed in the capillary region by one of photolithographic masking and etching.

35. The method of claim 30, wherein at least one of the evaporator region, capillary region and condenser region are flexible structures.

36. The method of claim 35, wherein the flexible structures have notches etched out of substrates of the flexible structures to thereby make the substrates flexible.

37. The method of claim 29, further comprising providing the transport fluid, wherein the transport fluid is one of an alcohol, water or freon.

38. The method of claim 29, wherein the apparatus is formed using high thermal conductivity materials.

39. The method of claim 29, wherein the one or more hot point elements are conically shaped hot point elements.

40. The method of claim 29, wherein the evaporator region and condenser region are concentrically disposed.

41. The method of claim 29, wherein the apparatus has a linear geometry.

* * * * *